(12) United States Patent
Wang et al.

(10) Patent No.: US 6,535,156 B1
(45) Date of Patent: Mar. 18, 2003

(54) METHOD AND APPARATUS FOR A FOLDING ANALOG-TO-DIGITAL CONVERTER (ADC) HAVING A COARSE DECODER WITH REDUCED COMPLEXITY

(75) Inventors: Dong Wang, Sacramento, CA (US); Tunde Gyurics, Davis, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/752,064

(22) Filed: Dec. 28, 2000

(51) Int. Cl.[7] .......................... H03M 1/00; H03M 1/10; H03M 1/12
(52) U.S. Cl. .................. 341/156; 341/120; 341/129
(58) Field of Search .................. 341/156, 155, 341/159, 118, 120, 168, 129, 131, 162

(56) References Cited

U.S. PATENT DOCUMENTS 5,053,771 A * 10/1991 McDermott ............... 341/156
5,126,742 A * 6/1992 Schmidt et al. ........... 341/156
5,353,027 A * 10/1994 Vorenkamp et al. ....... 341/156
5,745,067 A * 4/1998 Chou et al. ............... 341/156

OTHER PUBLICATIONS

B. Nauta, "A 70–MS/s 110–mW 8–b CMOS Folding and Interpolating A/D Converter" IEEE JSSC, Dec. 1995.
M. Flynn, "A 400–Msample/s, 6–b CMOS Foldng and Interpolating ADC" IEEE JSSC, Dec. 1998.

* cited by examiner

Primary Examiner—Patrick Wamsley
(74) Attorney, Agent, or Firm—Blakely, Sokoloff, Taylor & Zafman LLP

(57) ABSTRACT

A method that correlates a course analog to digital converter (ADC) output value against a folded fine ADC transfer curve slope value to determine an ADC circuit region. The folded fine ADC has a greater resolution than the course ADC. A decoder that correlates a course analog to digital converter (ADC) output value against a folded fine ADC transfer curve slope value to determine an ADC circuit region. The folded fine ADC has greater resolution than the course ADC.

50 Claims, 4 Drawing Sheets

| INPUT | | | OUTPUT |
|---|---|---|---|
| COARSE ADC OUTPUT | SLOPE | MOST SIGNIFICANT FINE ADC OUTPUT BIT | REGION |
| 0 0 0 | 0 | 0 | 0 |
| 0 0 0 | 0 | 1 | 2 |
| 0 0 1 | 0 | X | 2 |
| 0 1 1 | 0 | X | 4 |
| 1 1 1 | 0 | X | 4 |
| 0 0 0 | 1 | X | 1 |
| 0 0 1 | 1 | X | 3 |
| 0 1 1 | 1 | X | 3 |
| 1 1 1 | 1 | X | 5 |
| | | X = DON'T CARE | |

300

0 = NOT A POSITIVE SLOPE
1 = POSITIVE SLOPE

FIG. 3

METHOD AND APPARATUS FOR A FOLDING ANALOG-TO-DIGITAL CONVERTER (ADC) HAVING A COARSE DECODER WITH REDUCED COMPLEXITY

FIELD OF THE INVENTION

The field of invention relates generally to electronic circuit design; and, more specifically, to a method and apparatus for a folding analog-to-digital converter (ADC) having a coarse decoder with reduced complexity.

BACKGROUND

FIG. 1 shows a folding analog-to-digital converter (ADC) circuit 100. A folding ADC circuit typically includes a fine ADC 101, a fine decoder 102, a coarse ADC 103, a coarse decoder 104 and a mapping unit 105. The coarse ADC 103 typically comprises a "tree" of comparators 150 that each have a corresponding threshold voltage.

The threshold voltages increase with each step up the tree (i.e., TH1<TH2 <TH3<TH4). As the amplitude of the analog input signal 106 increases, the number of comparators in the tree 150 that indicate the analog signal 106 has surpassed their corresponding threshold voltage will increase. For example, if the amplitude of the analog signal 106 is between the first threshold TH1 and the second threshold TH2, only the first comparator 107 will provide a logical "1", all others will provide a logical zero.

However, if the amplitude of the analog input signal 106 is between the third threshold TH3 and the fourth threshold TH4, the first through third comparators 107 through 109 will provide a logical "1". Only the highest comparator 110 in the tree 150 will provide a logical zero. The output signal format of the coarse ADC 103 is referred to as "thermometer code" because the number of logical "1s" in the coarse ADC output signal increases in an "upward" direction, similar to the mercury in a thermometer, as the amplitude of the analog signal 106 grows.

The coarse ADC 103 is deemed coarse because the threshold voltages TH1 through TH4 are spaced farther apart than those associated with the fine ADC 101. That is, the coarse ADC 103 is typically designed to help identify which of N measurement regions the input signal 106 amplitude is within. The measurement regions are spaced across a range $\Delta V_{ts}$ of the input signal 106 being measured. The comparator tree 150 has a comparator (and a corresponding threshold) for N−1 of the N measurement regions.

For example, as seen in the exemplary coarse ADC transfer curve 112 of FIG. 1, note that seven regions exist but only five measurement regions exist. Regions 0 and 6 correspond to underflow and overflow regions, respectively, where changes in input signal amplitude are not measured. That is, the thermometer output signal for both ADCs 103 and 101 corresponds to all "0s" in the underflow region 0 and all "1s" in the overflow region 6.

In the exemplary coarse ADC transfer curve 112 of FIG. 1, the measurement range of the input signal ΔVts is divided into five measurement regions (regions 1 through 5). As such, in this example, N=5 . Thus, the coarse ADC 103 has N−1=4 comparators 107 through 110 and threshold voltages TH1 through TH4. If the input signal 106 amplitude reaches a level just above TH1, the output of the first comparator 107 is a logical "1" while all other comparator outputs are a logical "0".

If the input signal 106 amplitude reaches a level just above TH3, comparators 107 through 109 will provide a logical "1" while comparator 110 will provide a logical "0". Thus the coarse ADC 103 helps identify which measurement region the input signal 106 amplitude corresponds to. In the former case above, the coarse ADC 103 indicates the input signal 106 amplitude is within region 2; while, in the latter case above, the coarse ADC 103 indicates the input signal 106 amplitude is within region 4.

An exemplary transfer function 113 for the fine ADC 101 is also shown in FIG. 1. Note that the fine ADC transfer function 113 may be viewed as being "folded" over the N measurement regions discussed above. That is, the transition from a lower region into a higher region causes the transfer function 113 to "fold" by changing its slope. The fine ADC 101 provides for finer measurement resolution because each measurement region is resolved to n different levels. This corresponds to an overall measurement resolution of $\Delta V_{ts}/(nN)$.

For example, the exemplary folded ADC transfer function 113 of FIG. 1 has: 1) seven regions (regions 0 through 6); 2) five measurement regions (i.e., N=5 where the measurement regions correspond to regions 1 through 5 as discussed above); 3) an input signal range ΔVts; and 4) resolution of the input signal to thirty two different levels within each measurement region (i.e., n=32). This corresponds to an overall input measurement resolution of $\Delta V_{ts}/160$ (where nN=32×5=160).

Each level within a measurement region has a corresponding output bit in the fine ADC 101 output signal. Thus, the input signal 106 amplitude within a particular measurement region is indicated by a rising or falling thermometer signal depending on which measurement region the input signal strength corresponds to.

For example, if the input voltage is within region 0, the fine ADC 101 output signal corresponds to thirty two zeros (i.e., 000 . . . 000 where all 26 bits replaced by the ellipsis are zero) which, as mentioned above, corresponds to the underflow region. Once the input voltage rises above Vo and surpasses Vo+$\Delta V_{ts}$/160 (i.e., enters region 1), the least significant bit of the fine ADC 101 output signal flips to a "1" (i.e., the fine ADC 101 output signal is 000 . . . 001 where all 26 bits replaced by the ellipsis are a logical 0).

If the input signal voltage continues to increase, the fine ADC 101 thermometer signal rises because the slope of the transfer curve is positive within region 1. When the input voltage surpasses Vo+16$\Delta V_{ts}$/160 the thermometer output signal will rise past "halfway" up the slope of the transfer function 113 within the first region. That is, an input signal 106 amplitude just above Vo+16$\Delta V_{ts}$/160 converts sixteen of the fine ADC's thirty two output bits into logical "1s" (i.e., 000 . . . 111 where of the 26 bits replaced by the ellipsis, the 13 most significant bits are a logical 0 and the 13 least significant bits are a logical 1). This corresponds to point 114 in FIG. 1.

If the input signal amplitude 106 continues to increase, eventually, the input signal 106 will surpass Vo+32$\Delta V_{ts}$/160. That is, an input signal 106. amplitude just above Vo+32$\Delta V_{ts}$/160 converts all thirty two of the fine ADC's output bits into logical "1s" (i.e., 111 . . . 111 where all 26 bits replaced by the ellipsis are a logical 1). This corresponds to point 115 in FIG. 1.

If the input signal continues to increase beyond the transfer curve fold observed at point 115, the thermometer output signal begins to "drop" because the transfer curve has a negative slope within region 2. Thus, if the input signal further increases to surpass TH1+16$\Delta V_{ts}$/160 (where TH1= Vo+32$\Delta V_{ts}$/160), the fine ADC 101 output signal will fall "halfway" down the slope of the transfer function 113 within the second region.

In an embodiment, the input signal 106 voltage will convert the least significant sixteen of the thirty two fine ADC output bits from logical "1s" to logical "0s" (i.e., 111 . . . 000 where of the 26 bits replaced by the ellipsis, the 13 most significant bits are a logical 1 and the 13 least significant bits are a logical 0). This corresponds to point 116 in FIG. 1. Eventually, if the input signal 106 rises to just above TH1+32$\Delta V_{ts}$/160, the thermometer signal will be all "0s". This corresponds to point 117 in FIG. 1.

Note that, whereas in region 1 the fine ADC 101 thermometer output signal may be viewed as continually adding a 1 against a backdrop of 0s for each rise in input signal amplitude, in region 2 the fine ADC 101 thermometer output signal may be viewed as continually adding a 0 against a backdrop of 1s for each rise in input signal amplitude. That is, in region 1 the "mercury" in the thermometer is a 1 while in region 2 the "mercury" in the thermometer is a 0.

Regardless, it may be said that within region 1 the number of is in the fine ADC 101 output signal increases as the input signal voltage rises; and that, within region 2 the number of 1s in the fine ADC 101 output signal decrease as the input signal voltage rises. Thus region 1 has a positive slope and region 2 has a negative slope. Regions 3 and 5 operate as described for region 1 while region 4 operates as described for region 2.

Note that a "cyclical" thermometer output signal follows naturally from the folded transfer function 113 of the fine ADC 101. That is, as the input signal increases across the range $\Delta Vts$ the fine ADC 101 was designed to measure across, the thermometer output signal traces a triangular waveform having a period of 2 measurement regions.

The fine decoder 102 converts the number of "1s" from the fine ADC 101 output signal into a binary value. For example, if all 32 bits of the fine ADC 101 output signal are a logical "1",the fine decoder 102 output signal is "100000". As another example, if 16 bits of the fine ADC 101 output signal are a logical "1",the fine decoder 102 output signal is "010000". This allows for proper interpretation of the fine ADC 101 output signal even though the "mercury" may switch from 1 to 0 or 0 to 1 over the course of the folded transfer curve 113.

The coarse decoder 104 converts the number of "1s" from the coarse ADC 103 output signal into a binary value. For example, if the input signal 106 amplitude is within the fifth measurement region, the coarse ADC 103 output signal will be "1111". Hence, the coarse decoder 104 output signal will be "100". As another example, if the input signal 106 amplitude is within the first measurement region, the coarse ADC 103 output signal will be "0000". Hence, the course decoder 104 output signal will be "000".

A binary value corresponding to the input signal 106 amplitude is provided by the mapping unit 105 which is designed to effectively understand: 1) the measurement region that the input signal is within (as provided by the coarse ADC decoder 104); and 2) the amplitude of the input signal 106 within the particular region indicated by the course ADC decoder 104 (as provided by the fine ADC decoder 102) from an understanding of the folded transfer function 113 of the fine ADC 101.

That is, the mapping unit 105 understands that within region 1 increasing fine ADC decoder 102 output values correspond to an increasing signal amplitude while, in region 2, decreasing fine ADC decoder 102 output values correspond to an increasing signal amplitude. In short, the mapping unit 105 converts the ADC decoder 102, 104 output values into an understanding of the approximate input signal 106 amplitude so that it may be represented as a binary value.

BRIEF DESCRIPTION OF THE DRAWINGS

The present invention is illustrated by way of example, and not limitation, in the Figures of the accompanying drawings in which:

FIG. 3 shows a look up table that may be implemented by the coarse decoder of FIG. 2.

DETAILED DESCRIPTION

A method is described that correlates a coarse analog to digital converter (ADC) output value against a folded fine ADC transfer curve slope value to determine an ADC circuit region. The folded fine ADC has a greater resolution than the coarse ADC. A decoder is described that correlates a course analog to digital converter (ADC) output value against a folded fine ADC transfer curve slope value to determine an ADC circuit region. The folded fine ADC has greater resolution than the coarse ADC.

Figure 1:
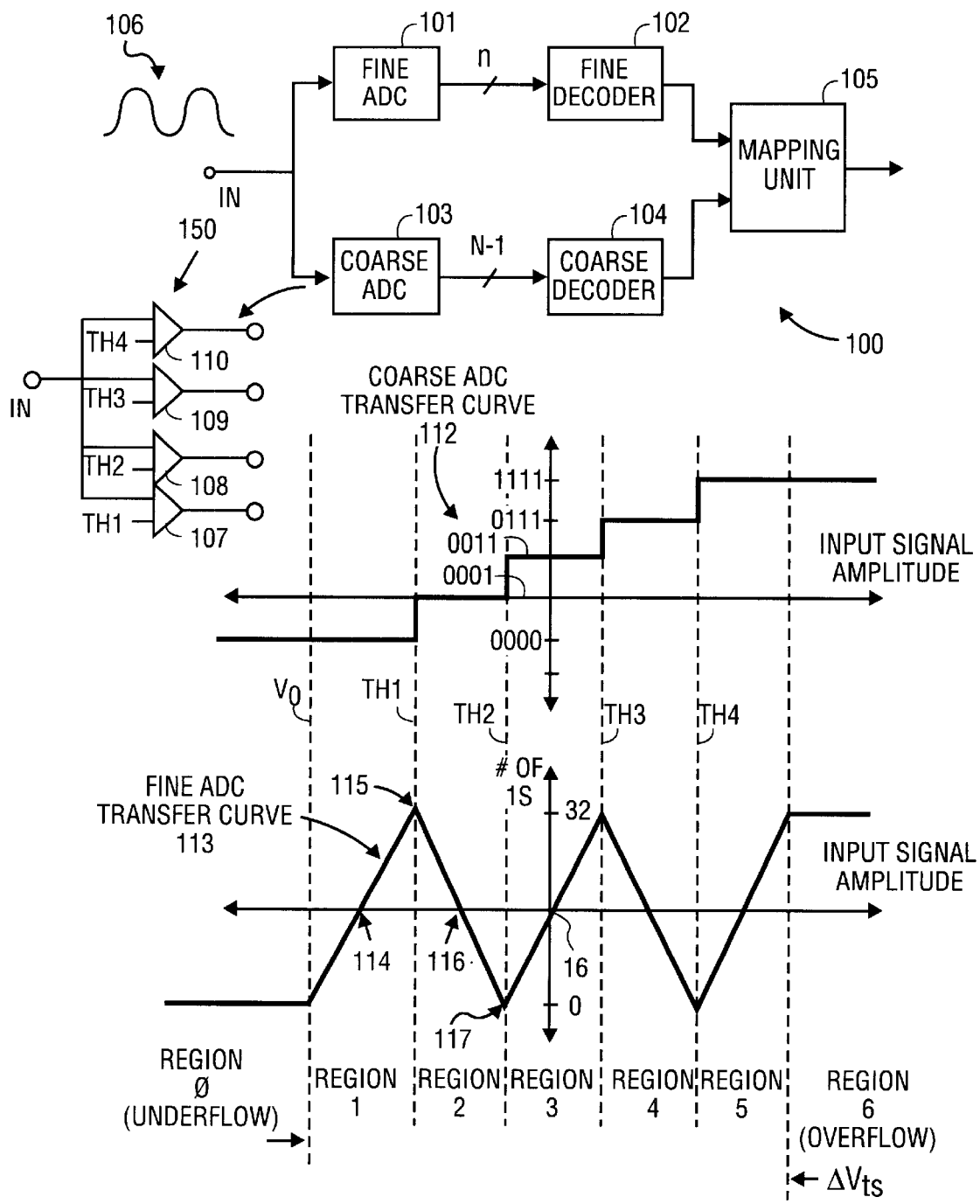
FIG. 1 shows a prior art ADC circuit.
Figure 2:
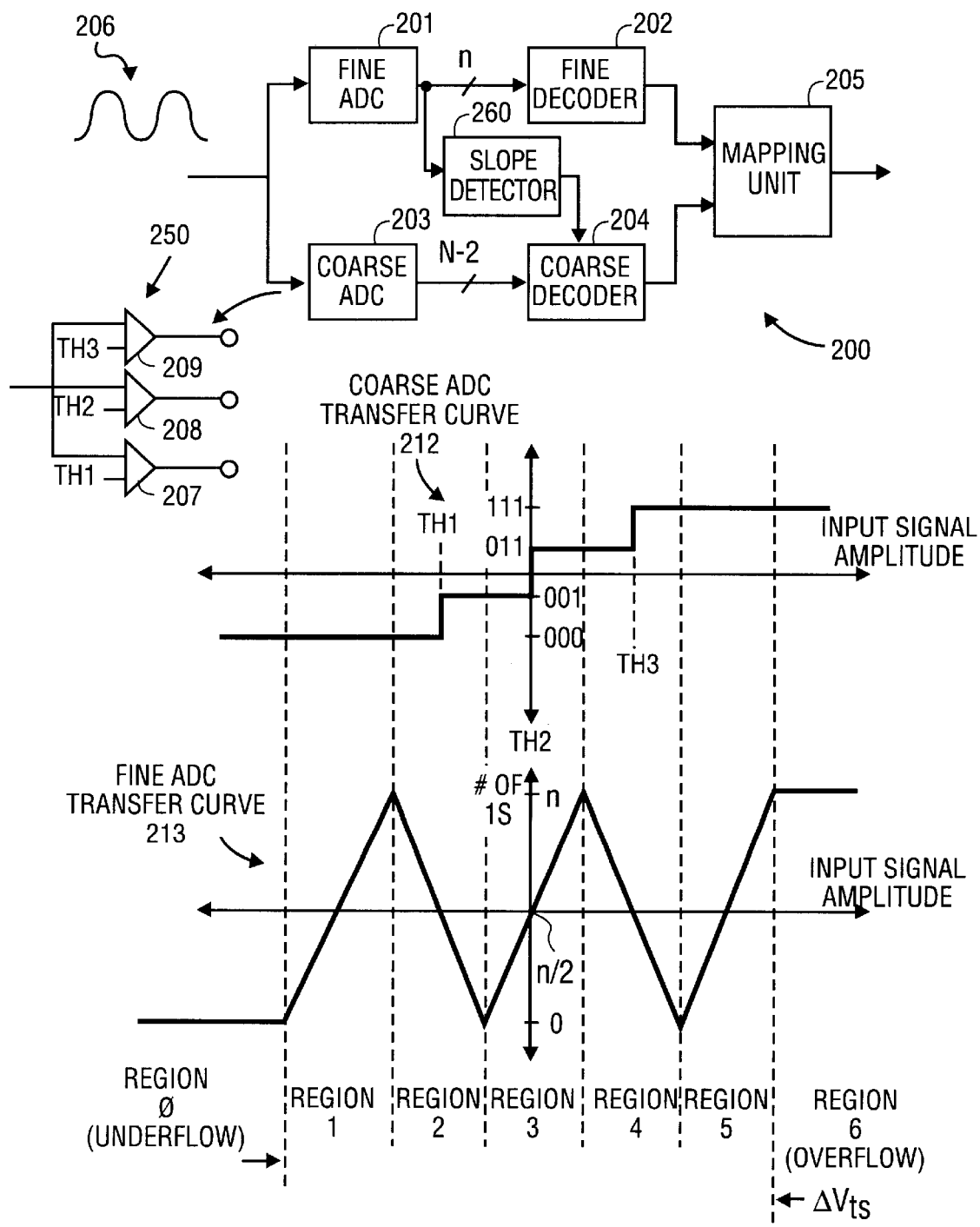
FIG. 2 shows an ADC circuit having a less complex coarse ADC than the ADC circuit of FIG. 1.

FIG. 2 shows an ADC circuit 200 having a less complex coarse ADC 203 than the coarse ADC 103 of the folding ADC of FIG. 1. Whereas the coarse ADC 103 of FIG. 1 has N−1 comparators and corresponding threshold voltages, the coarse ADC 203 of FIG. 2 has N−2 comparators and N−2 corresponding threshold voltages (where N corresponds to the number of measurement regions).

In the exemplary circuit of FIG. 2, a coarse ADC 203 is coupled to the coarse decoder 204 and a fine ADC 201 is coupled to a fine decoder 202. In an embodiment, the fine ADC 201 and the fine decoder 202 of the improved folded ADC circuit 200 of FIG. 2 respectively correspond to the fine ADC 101 and the fine decoder 102 of the prior art ADC circuit of FIG. 1.

The exemplary ADC circuit 200 of FIG. 2 has five measurement regions (i.e., region 1 through region 5). As such, N=5 for this embodiment. Note the transfer curve 212 of the less complex coarse ADC 203 of FIG. 2 corresponds to a thermometer output signal having four different states (000, 001, 011, 111).

For input signal 206 amplitudes below and including TH1, the coarse ADC 203 output signal corresponds to 000. For input signal 206 amplitudes greater than TH1 and less than or equal to TH2, the coarse 203 output signal corresponds to 001. For input signal amplitudes greater than TH2 and less than or equal to TH3, the coarse ADC 203 output signal corresponds to 011. For input signal amplitudes above TH3, the coarse ADC 203 output signal corresponds to 111.

Note that in the embodiment of FIG. 2, the different output states of the coarse ADC 203 "straddle" measurement regions rather than "line up" with them. That is, for example, an input signal between TH1 and TH2 may be within either measurement region 2 or measurement region 3. Similarly, an input signal beneath TH1 may be within either measurement region 2 or measurement region 1; an input signal between TH2 and TH3 may be within measurement region 3 or measurement region 4; and an input signal above TH3 may be within measurement region 4 or measurement region 5.

The coarse decoder 204 accepts an indication of the present slope of the fine ADC transfer curve 213 in order to determine which measurement region the input signal amplitude falls within. That is, for example, recalling that an input signal amplitude between TH1 and TH2 may correspond to either region 2 or region 3: note that the slope of the fine ADC transfer curve 213 is negative within region 2 and positive within region 3.

Similarly, if the input signal amplitude is below TH1, a positive fine ADC transfer curve 213 slope corresponds to measurement region 1 while a negative ADC transfer curve 213 slope corresponds to measurement region 2; if the input signal amplitude is between TH2 and TH3, a positive fine ADC transfer curve 213 slope corresponds to measurement region 3 while a negative ADC transfer curve 213 slope corresponds to measurement region 4; if the input signal amplitude is above TH3, a positive fine ADC transfer curve 213 slope corresponds to measurement region 5 while a negative ADC transfer curve 213 slope corresponds to measurement region 4.

The present slope of the fine ADC transfer curve 213 is the slope of the fine ADC transfer curve at the output data point being offered by the fine ADC 201. An indication of the present slope of the fine ADC transfer curve 213 is provided by slope detector 260. The slope detector 260 can determine whether the fine ADC 201 is operating in a positive slope region or a negative slope region by observing changes in the fine ADC 201 output signal.

Recall that, whereas in region 1 the fine ADC 201 thermometer output signal may be viewed as continually adding a 1 against a backdrop of 0s for each rise in input signal amplitude, in region 2 the fine ADC 201 thermometer output signal may be viewed as continually adding a 0 against a backdrop of is for each rise in input signal amplitude. That is, in region 1 the "mercury" in the thermometer is a 1 while in region 2 the "mercury" in the thermometer is a 0.

In various embodiments, in a sense, the slope detector determines whether or not the "mercury" is a 1 or a 0. Consistent with the embodiments discussed above, if the mercury is a "1" the slope is positive and if the mercury is a "0" the slope is negative. Thus, the fine ADC transfer curve 213 is along a positive slope if the most significant bit is a "0" and the least significant bit is a "1" and the fine ADC transfer curve 213 is along a negative slope if the most significant bit is a "1" and the least significant bit is a "0". The slope detector 260 can then indicate which slope of the fine ADC transfer curve 213 is active for the particular measurement being made by the fine ADC 201.

Note also that the fine ADC curve 213 is at a top peak if the least significant bit and most significant bit are a "1";and that the fine ADC curve is at a bottom peak if the least significant bit and most significant bit are a "0". In an embodiment, the slope detector 260 has a one bit output where a "1" corresponds to "a positive slope or a top peak" and a "0" corresponds to "not a positive slope and not a top peak" (i.e., a negative slope or a bottom peak).

In this case, the most significant bit of the fine ADC output may also be coupled to the coarse ADC 203 so that the coarse ADC decoder 204 can determine whether or not the fine ADC 201 is in region 0 or region 2. That is, within region 0 and within region 2 a coarse ADC 203 output of "000" is possible and a slope detector output of 0 is possible. However, in region 0 the most significant bit of the fine ADC 201 output is 0 while in region 2 the most significant bit of the fine ADC 201 output is 1.

The fine decoder 202 converts the number of "1s" from the fine ADC 201 output signal into a binary value. For example, if all 32 bits of the fine ADC 201 output signal are a logical "1",the fine decoder 202 output signal is "100000". As discussed above, this allows for proper interpretation of the fine ADC 201 output signal even though the "mercury" may switch from 1 to 0 or 0 to 1 over the coarse of the folded transfer curve 213.

The coarse decoder 204 correlates the course ADC 203 output signal with the slope detector 260 output to determine which region the input signal 206 amplitude is within. FIG. 3 shows a truth table 300 that the course decoder 204 may use to effectively perform the correlation Note that the particular truth table embodiment 300 of FIG. 3 corresponds to the ADC circuit embodiment described just above where the slope detector 260 output is one bit where a "1" corresponds to "a positive slope or a top peak" and a "0" corresponds to "not a positive slope and not a top peak" (i.e., a negative slope or a bottom peak). The most significant bit of the fine ADC 201 output is used to determine whether the input signal is within measurement region 0 or region 2.

A binary value corresponding to the input signal 206 amplitude is provided by the mapping unit 205 which is designed to effectively understand: 1) the measurement region that the input signal is within (as provided by the coarse ADC decoder 204); and 2) the amplitude of the input signal 206 within the particular region indicated by the coarse ADC decoder 204 (as provided by the fine ADC decoder 202) from an understanding of the folded transfer function 213 of the fine ADC 201.

That is, the mapping unit 205 understands that within region 1 increasing fine ADC decoder 202 output values correspond to an increasing signal amplitude while, in region 2, decreasing fine ADC decoder 202 output values correspond to an increasing signal amplitude. In short, the mapping unit 205 converts the ADC decoder 202, 204 output values into an understanding of the approximate input signal 206 amplitude so that it may be represented as a binary value. The binary value may then be processed by a processor such as a digital signal processor (DSP), a general purpose processor (GPP), or a combination of the two.

Figure 4:
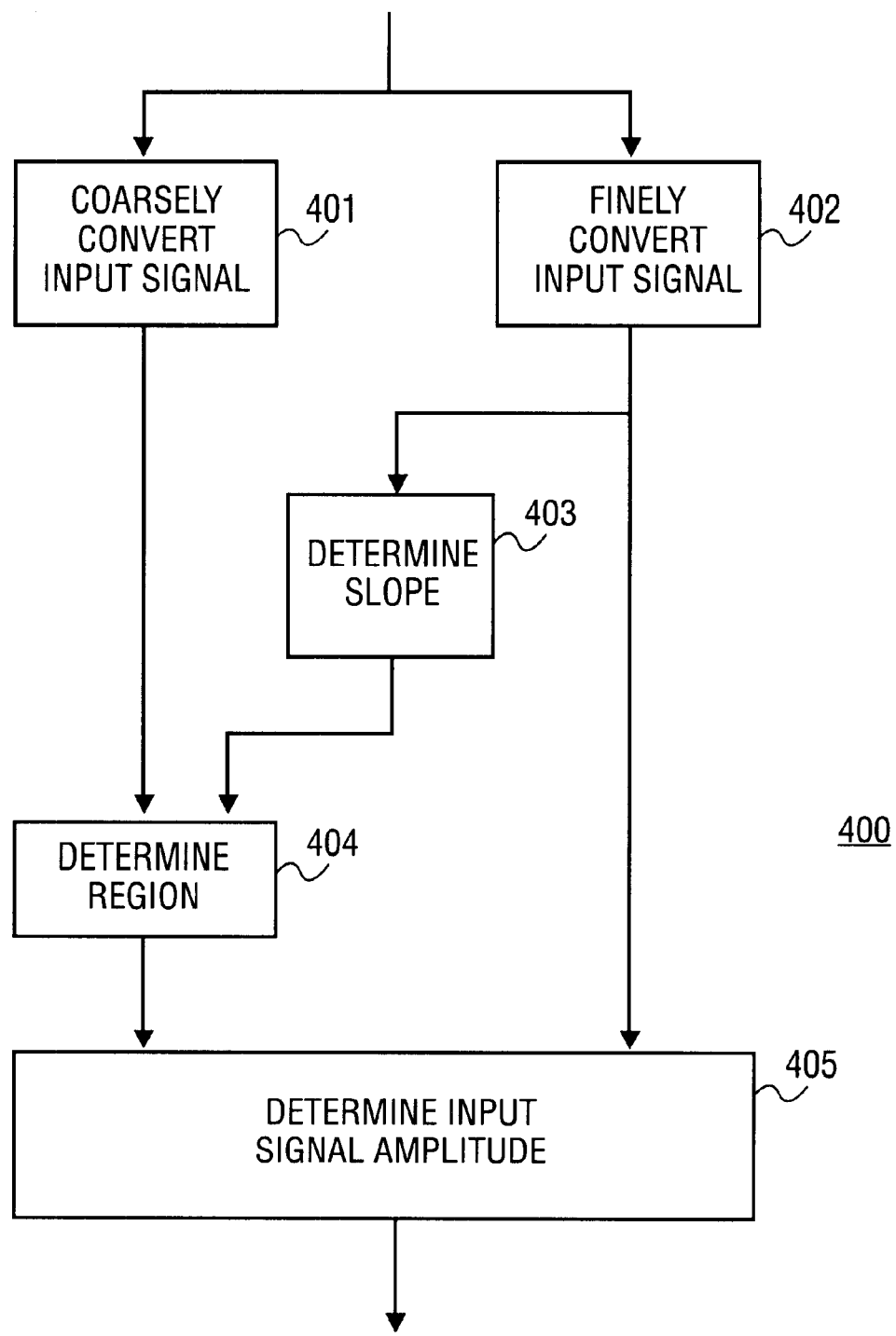
FIG. 4 shows a method for the ADC circuit of FIG. 2.

FIG. 4 shows a method 400 that describes the operation of the ADC circuit of FIG. 2. First, the input signal is coarsely converted 401 from the analog domain to the digital domain and finely converted 402 from the analog to digital domain as a cyclical thermometer code (where a cyclical thermometer code results naturally from a folded ADC transfer curve). Note that a fine. conversion has a higher measurement resolution than a course conversion.

The slope of the folded fine transfer curve at the position from which the fine conversion 402 was made is then determined 403. The region that the input signal falls within is determined 404 from the previously made course conversion 401 and slope determination 403. The input signal amplitude is then determined 405 from the fine conversion 402 and the determination 404 of the region that the input signal is within.

Note also that embodiments of the present description may be implemented not only within a semiconductor chip but also within machine readable media. For example, the designs discussed above may be stored upon and/or embedded within machine readable media associated with a design tool used for designing semiconductor devices. Examples include a netlist formatted in the VHSIC Hardware Description Language (VHDL) language, Verilog language or SPICE language. Some netlist examples include: a behaviorial level netlist, a register transfer level (RTL) netlist, a gate level netlist and a transistor level netlist. Machine readable media also include media having layout information such as a GDS-II file. Furthermore, netlist files or other machine readable media for semiconductor chip design may be used in a simulation environment to perform the methods of the teachings described above.

Thus, it is also to be understood that embodiments of this invention may be used as or to support a software program executed upon some form of processing core (such as the CPU of a computer) or otherwise implemented or realized upon or within a machine readable medium. A machine readable medium includes any mechanism for storing or transmitting information in a form readable by a machine (e.g., a computer). For example, a machine readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method, comprising:
   determining an analog to digital converter (ADC) measurement region from an output of a coarse ADC and from an indication of a folded fine ADC transfer curve slope polarity, said folded fine ADC able to convert an analog input signal to a finer degree of resolution than said coarse ADC, said ADC having a unique measurement region for each fold in said folded fine ADC transfer curve.

2. The method of claim 1 further comprising determining said folded fine ADC transfer curve slope by determining if said thermometer code has a backdrop of 1s or a backdrop of 0s.

3. The method of claim 2 further comprising examining the most significant and the least significant bits of said folded fine ADC transfer curve output.

4. The method of claim 1 further comprising providing a binary value representative of an amplitude of said analog input signal based upon an understanding of said folded fine ADC transfer curve and said ADC circuit region.

5. The method of claim 4 further comprising processing said binary value with a processor.

6. The method of claim 1 wherein said folded fine ADC transfer curve has N measurement regions.

7. The method of claim 6 further comprising changing an output value of said coarse ADC within at least one of said N measurement regions.

8. The method of claim 1 further comprising providing a folded fine ADC output signal that is formatted in thermometer code.

9. An apparatus, comprising:
   a decoder that determines an analog to digital converter (ADC) measurement region from an output of a coarse ADC and from an indication of a folded fine ADC transfer curve slope polarity, said folded fine ADC able to convert an analog input signal to a finer degree of resolution than said coarse ADC, said ADC having a unique measurement region for each fold in said folded fine ADC, transfer curve.

10. The apparatus of claim 9 wherein said folded fine ADC transfer curve has N measurement regions.

11. The apparatus of claim 10 wherein said coarse ADC further comprises a tree of comparators, each comparator having a unique threshold voltage.

12. The apparatus of claim 11 wherein said coarse ADC further comprises N–2 comparators.

13. The apparatus of claim 11 wherein at least one of said threshold voltages is within one of said N measurement regions.

14. The apparatus of claim 11 wherein said coarse ADC provides an output value formatted in thermometer code.

15. The apparatus of claim 9 wherein said fine ADC provides an output value formatted in thermometer code.

16. The apparatus of claim 15 further comprising a slope detector that determines said fine ADC transfer curve slope polarity in order to provide said indication.

17. An apparatus, comprising:
   a) decoder that determines an analog to digital converter (ADC) measurement region from an output of a coarse ADC and from an indication of a folded fine ADC transfer curve slope polarity, said folded fine ADC able to convert an analog input signal to a finer degree of resolution than said coarse ADC, said ADC having a unique measurement region for each fold in said folded fine ADC transfer curve;
   b) a mapping unit that provides a binary value representative of an amplitude of said analog input signal based upon said ADC measurement region and an understanding of said folded fine ADC transfer curve;
   c) a processor coupled to said mapping unit.

18. The apparatus of claim 17 wherein said folded fine ADC transfer curve has N measurement regions.

19. The apparatus of claim 18 wherein said coarse ADC further comprises a tree of comparators, each comparator having a unique threshold voltage.

20. The apparatus of claim 19 wherein said coarse ADC further comprises N–2 comparators.

21. The apparatus of claim 19 wherein at least one of said threshold voltages is within one of said N measurement regions.

22. The apparatus of claim 19 wherein said coarse ADC provides an output value formatted in thermometer code.

23. The apparatus of claim 17 wherein said fine ADC provides an output value formatted in thermometer code.

24. The apparatus of claim 23 further comprising a slope detector that determines said fine ADC transfer curve slope polarity in order to provide said indication.

25. An apparatus, comprising:
   an Analog-to-Digital Converter (ADC) that decodes both a fine ADC output and a coarse ADC output in order to provide a digital representation of an analog input signal, said fine ADC having a first transfer curve whose slope changes polarity when transitioning from a first measurement region to a second measurement region, wherein, said first measurement region neighbors said second measurement region, said coarse ADC having a second transfer curve that changes from a first output state to a second output state within said first measurement region, wherein, said second transfer curve also changes from said second output state to a third output state within said second measurement region.

26. The apparatus of claim 25 further comprising a slope detector that determines whether said fine ADC is operating within a positively sloped fine ADC transfer curve measurement region or within a negatively sloped fine ADC transfer curve measurement region.

27. The apparatus of claim 26 herein a said positively sloped fine ADC transfer curve measurement region is identified by said slope detector if a most significant bit of said fine ADC output is at a first logical state and a least significant bit of said fine ADC output is at a second logical state.

28. The apparatus of claim 27 wherein a said negatively sloped fine ADC transfer curve measurement region is identified by said slope detector if said most significant bit is at said second logical state and said least significant bit is at said first logical state.

29. The apparatus of claim 28 further comprising a coarse decoder that said decodes said coarse ADC output, said coarse decoder having an input that receives said determination made by said slope detector.

30. The apparatus of claim 25 further comprising a processor that receives said digital representation.

31. The apparatus of claim 30 wherein said processor is a general purpose processor.

32. The apparatus of claim 30 wherein said processor is a digital signal processor.

33. The apparatus of claim 25 further comprising a fine decoder that said decodes said fine ADC output.

34. The apparatus of claim 25 wherein said fine ADC transfer curve further comprises N measurement regions and said coarse ADC further comprises a tree of N−2 comparators.

35. The apparatus of claim 25 wherein said fine ADC output is presented in a thermometer code.

36. The apparatus of claim 25 wherein said coarse ADC output is presented in a thermometer code.

37. An apparatus, comprising:
an Analog-to-Digital Converter (ADC) having a first decoder that receives a first output from a first ADC, said ADC having a second decoder that receives a second output from a second ADC, said first ADC having a first transfer curve whose slope is a first polarity within a first measurement region and whose slope is not said first polarity within a second measurement region, said first measurement region neighboring said second measurement region, said second ADC having a second transfer curve that changes from a first output state to a second output state within said first measurement region, wherein said second transfer curve also changes from said second output state to a third output state within said second measurement region.

38. The apparatus of claim 37 further comprising a slope detector that determines whether said first ADC is operating within a positively sloped first ADC transfer curve measurement region or within a negatively sloped first ADC transfer curve measurement region.

39. The apparatus of claim 38 wherein a said positively sloped first ADC transfer curve measurement region is identified by said slope detector if a most significant bit of said first ADC output is at a first logical state and a least significant bit of said first ADC output is at a second logical state.

40. The apparatus of claim 39 wherein a said negatively sloped first ADC transfer curve measurement region is identified by said slope detector if said most significant bit is at said second logical state and said least significant bit is at said first logical state.

41. The apparatus of claim 38 further comprising a second decoder that said decodes said second ADC output, said second decoder having an input that receives said determination made by said slope detector.

42. The apparatus of claim 37 further comprising a processor that receives said digital representation.

43. The apparatus of claim 42 wherein said processor is a general purpose processor.

44. The apparatus of claim 42 wherein said processor is a digital signal processor.

45. The apparatus of claim 37 wherein said first ADC is a fine ADC and said second ADC is a coarse ADC, said fine ADC able to convert an input signal provided to said ADC to a finer degree of resolution than said coarse ADC.

46. The apparatus of claim 37 further comprising a first decoder that said decodes said first ADC output.

47. The apparatus of claim 37 wherein said first ADC transfer curve further comprises N measurement regions and said second ADC further comprises a tree of N−2 comparators.

48. The apparatus of claim 37 wherein said first ADC output is presented in a thermometer code.

49. The apparatus of claim 37 wherein said coarse ADC output is presented in a thermometer code.

50. An Analog-to-Digital Converter (ADC), comprising:
a coarse ADC decoder that determines which measurement region a coarse ADC is operating within, said coarse ADC decoder having a first input that receives an output value from said coarse ADC, said coarse decoder having a second input that receives an indication of a polarity that a fine ADC transfer curve slope is operating along.

* * * * *